US008224590B2

(12) United States Patent
Cho et al.

(10) Patent No.: US 8,224,590 B2
(45) Date of Patent: Jul. 17, 2012

(54) APPARATUS AND METHOD OF INSPECTING MASK

(75) Inventors: Chan-Hyeong Cho, Yongin (KR); Kyoung-Wook Min, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 349 days.

(21) Appl. No.: 12/607,285

(22) Filed: Oct. 28, 2009

(65) Prior Publication Data
US 2010/0228501 A1 Sep. 9, 2010

(30) Foreign Application Priority Data

Mar. 4, 2009 (KR) ........................ 10-2009-0018461

(51) Int. Cl.
*G06F 19/00* (2006.01)
*G06K 9/00* (2006.01)
(52) U.S. Cl. .......................... 702/40; 382/152
(58) Field of Classification Search .................. 702/40, 702/84; 382/141, 152, 209; 356/124, 239; 358/156
See application file for complete search history.

(56) References Cited

U.S. PATENT DOCUMENTS

| 7,692,128 | B2 * | 4/2010 | Takizawa et al. | ........ 250/201.1 |
| 2007/0285728 | A1 * | 12/2007 | Horie et al. | ........ 358/3.06 |
| 2009/0304262 | A1 * | 12/2009 | Harabe | ........ 382/152 |

FOREIGN PATENT DOCUMENTS

| EP | 0 300 572 A1 | 1/1989 |
| JP | 2003-149161 | 5/2003 |
| WO | WO 01/13333 A1 | 2/2001 |

OTHER PUBLICATIONS

European Search Report dated Jun. 14, 2011, for corresponding European Patent application 10154647.1, noting listed references in this IDS.
Yamamoto, J., et al., *EPL Stencil Mask Defect Inspection System Using a Transmission Electron Beam*, Proceedings of SPIE, (2003), vol. 5037, pp. 531-537, XP-002639306.
Yonekura, I., et al., *Defect Inspection Strategy of LEEPL Masks*, Proceedings of SPIE, (2005), vol. 5853, No. 1, pp. 933-943, XP-002639307.
Korean Office Action dated Feb. 11, 2011 issued by the KIPO for corresponding Korean Patent Application No. 10-2009-0018461, 5 pages, citing JP 2003-149161 (No English language).

* cited by examiner

*Primary Examiner* — Bryan Bui
(74) *Attorney, Agent, or Firm* — Christie, Parker & Hale, LLP

(57) ABSTRACT

A mask inspecting apparatus and method of inspecting a mask having a plurality of openings used in deposition in a desired pattern, the mask inspecting apparatus capable of detecting a defect of the mask through the openings of the mask. The mask inspecting apparatus includes: a detection unit detecting boundary line of each of the openings of the mask; a storage unit storing information about a member on which deposition is to be performed using the mask; a setting unit setting a first boundary line, a second boundary line, and a safety area for each of the openings using the stored information about the member on which deposition is to be performed, wherein the first boundary line forms an outline of a deposition area, the second boundary line surrounds the first boundary, and the safety area is interposed between the first boundary line and the second boundary line; and a control unit determining whether the boundary line of the mask detected by the detection unit does not contact the first boundary line and the second boundary line and whether it is present in the safety area.

18 Claims, 6 Drawing Sheets

APPARATUS AND METHOD OF INSPECTING MASK

CROSS-REFERENCE TO RELATED APPLICATION

This application claims the benefit of Korean Patent Application No. 10-2009-0018461, filed Mar. 4, 2009 in the Korean Intellectual Property Office, the disclosure of which is incorporated herein by reference.

BACKGROUND OF THE INVENTION

1. Field of the Invention

Aspects of the present invention relate to an apparatus and method of inspecting a mask, and more particularly, to an apparatus and method of inspecting a mask capable of detecting a defect of the mask through openings of the mask.

2. Description of the Related Art

In manufacturing an organic emitting layer of an organic light emitting display (OLED), the layer includes organic materials, which are vulnerable to moisture. Thus, it is difficult to form a pattern by using photolithography. Accordingly, a method of using a mask having predetermined openings and depositing a deposition material onto parts exposed through the openings is widely used to form the organic emitting layer.

A mask used in deposition is generally formed of a material including a metal. However, due to a manufacturing problem, a plurality of openings is not always formed in desired patterns. When there is an opening which is not formed in a desired pattern, deposition is not accomplished in the desired pattern. Thus, methods have been developed to inspect a mask before performing the deposition. In general, the methods include comparing openings adjacent to each other from among a plurality of openings and determining defects of the mask. However, all openings of the mask may not be accurately inspected using the methods described above and thus there is a limitation to improving accuracy of mask inspection.

SUMMARY OF THE INVENTION

Aspects of the present invention provide an apparatus and method of inspecting a mask capable of detecting a defect of the mask through openings of the mask According to an aspect of the present invention, there is provided a mask inspecting apparatus having a plurality of openings used in deposition in a desired pattern, the apparatus including: a detection unit detecting a boundary line of each of the openings of the mask; a storage unit storing information about a member on which deposition is to be performed using the mask; a setting unit setting a first boundary line, a second boundary line, and a safety area using for each of the openings the stored information about the member on which deposition is to be performed, wherein the first boundary line forms an outline of a deposition area, the second boundary line surrounds the first boundary line, and the safety area is interposed between the first boundary line and the second boundary line; and a control unit determining whether the boundary line of the mask detected by the detection unit does not contact the first boundary line and the second boundary line and whether the boundary line is present in the safety area.

According to an aspect of the present invention, the setting unit may set the first boundary line, the second boundary line, and the safety area as a virtual map according to the information about the member on which deposition is to be performed.

According to an aspect of the present invention, the information about the member on which deposition is to be performed may include information about a substrate, cells and sub-pixels on the substrate, and intervals between the sub-pixels.

According to an aspect of the present invention, the detection unit may be a charge-coupled device (CCD) camera.

According to an aspect of the present invention, the apparatus may further include an output unit outputting information about openings contacting at least one of the first boundary line and the second boundary line and are present in an area that is not in the safety area.

According to another aspect of the present invention, there is provided a method of inspecting a mask having a plurality of openings used in deposition in a desired pattern, the method including: preparing the mask having the plurality of openings formed in a predetermined pattern used in deposition in the desired pattern; setting a first boundary line, a second boundary line, and a safety area for each of the openings according to information about a member on which deposition is to be performed, wherein the first boundary line forms an outline of a deposition area, the second boundary line surrounds the first boundary line, and the safety area is interposed between the first boundary line and the second boundary line; and determining whether the boundary line of each of the openings of the mask does not contact the first boundary line and the second boundary line and whether the first and second boundary lines are present in areas that are not the safety areas.

According to an aspect of the present invention, the setting of the first boundary lines, the second boundary lines, and the safety areas, the first boundary lines, the second boundary lines, and the safety areas may be stored as a virtual map according to the information about the member on which deposition is to be performed.

According to an aspect of the present invention, the information about the member on which deposition is to be performed may include information about a substrate, cells and sub-pixels on the substrate, and intervals between the sub-pixels.

According to an aspect of the present invention, the boundary lines of the openings may be detected using a detection unit.

According to an aspect of the present invention, the detection unit may be a charge-coupled device (CCD) camera.

According to an aspect of the present invention, the method may further include outputting information about which of the openings, which are not present in the safety area, from among the plurality of openings after performing the determining.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
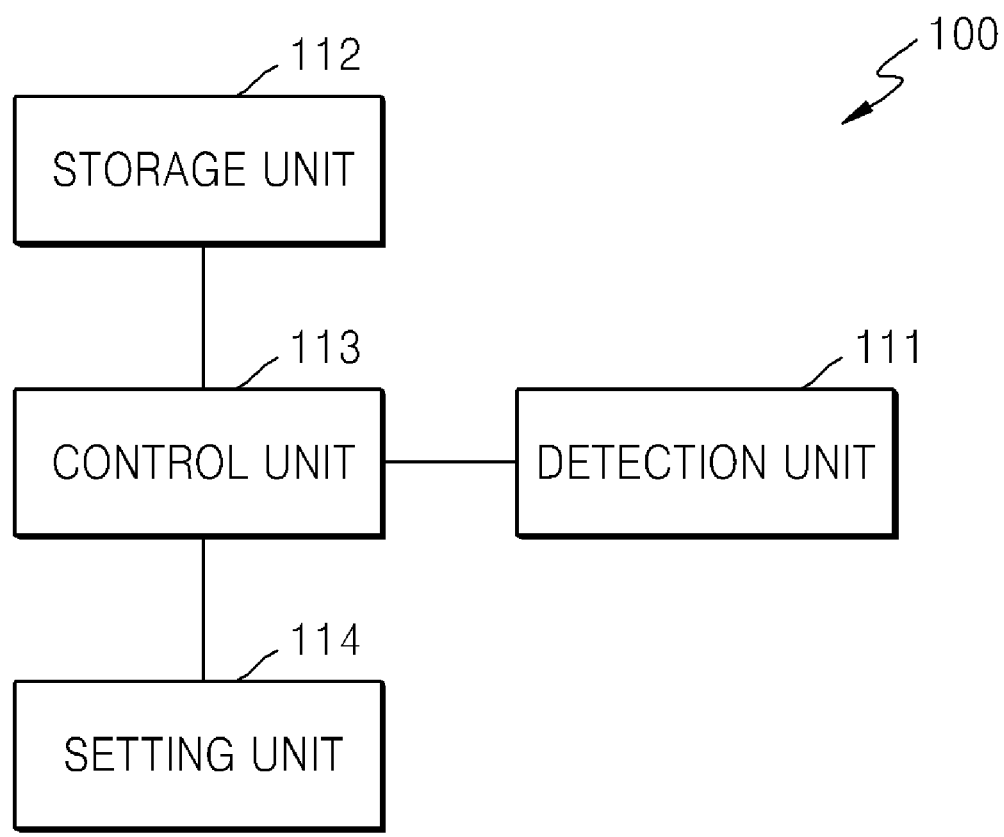
FIG. 1 is a block diagram of an apparatus for inspecting a mask according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a block diagram of a mask inspecting apparatus 100 according to an embodiment of the present invention. The mask inspecting apparatus 100 includes a detection unit 111, a storage unit 112, a control unit 113, and a setting unit 114. While not required in all aspects, the control unit 113 and/or the setting unit 114 can be one or more processors and/or can be implemented using a computer executing software read from a computer readable storage medium.

The detection unit 111 detects a boundary line of a mask. Accordingly, the detection unit 111 may be a camera, for example, a charge-coupled device (CCD) camera, or other similar detection devices. However, aspects of the present invention are not limited thereto.

The storage unit 112 stores information about a member on which deposition is to be performed using a mask. The storage unit 112 may be a memory such as a read only memory (ROM) or a random access memory (RAM), and can be magnetic and/or optical recording media. Further, the storage unit 112 can be internal or removable with respect to the mask inspecting apparatus 100.

The setting unit 114 sets a first boundary line, a second boundary line, and a safety area using the information about the member on which deposition is to be performed, which is stored in the storage unit 112. The first boundary line forms an outline of a deposition area, the second boundary line surrounds the first boundary. The safety area is interposed between the first boundary line and the second boundary line. The setting unit 114 may set the first boundary line, the second boundary line, and the safety area in the form of a table, on which coordinate values are written, or in the form of a map, by using the information about the member on which deposition is to be performed.

The control unit 113 determines whether the boundary line of the mask detected by the detection unit 111 is not adjacent to the first boundary line and the second boundary line and whether it is within the safety area. For example, the first boundary line, second boundary line, and safety area set in the form of a map by the setting unit 114 are compared with the boundary line of the mask detected by the detection unit 111.

The control unit 113 controls the entire operation of a central processing unit (CPU) and the mask inspecting apparatus 100. In FIG. 1, the control unit 113, the storage unit 112, and the setting unit 114 are separately illustrated. However, the present embodiment is not limited thereto. The storage unit 112 or the setting unit 114 may be included in the control unit 113. Also, both the storage unit 112 and the setting unit 114 may be included in the control unit 113.

The storage unit 112 stores the information about the member on which deposition is to be performed. Here, the type of member on which deposition is to be performed may vary. As an example, the member on which deposition is to be performed may be a substrate of an organic light emitting display (OLED).

Figure 2:
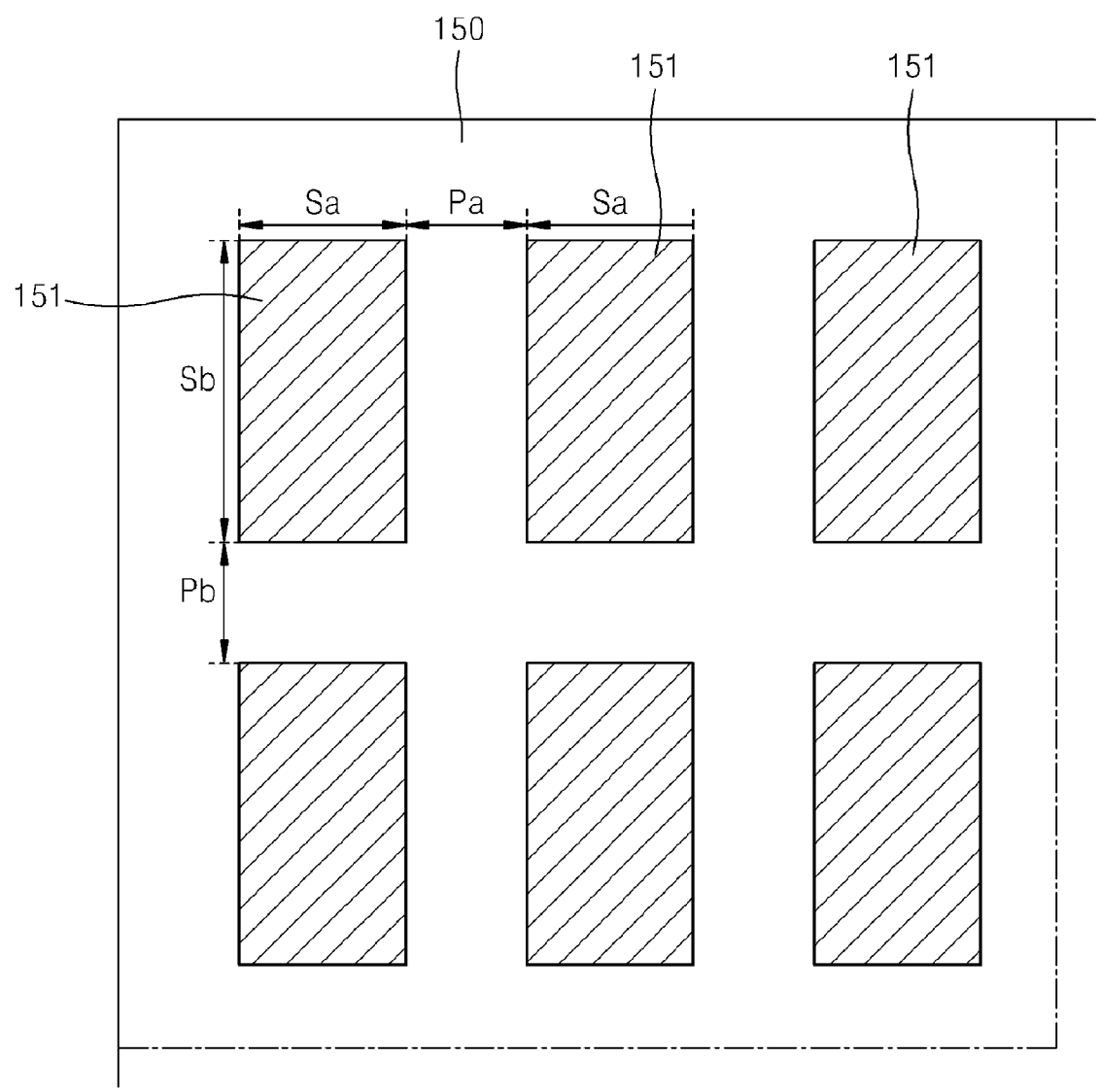
FIG. 2 is a plan view of a substrate on which deposition is to be performed.

FIG. 2 is a plan view of a substrate 150 on which deposition is to be performed. A plurality of sub-pixels 151 are formed on the substrate 150. Although not illustrated in FIG. 2, the substrate 150 may include a plurality of cells and each of the cells includes the plurality of sub-pixels 151. Also, one cell may be formed on the substrate 150, however, aspects of the present invention are not limited thereto.

The sub-pixels 151 may be formed to have the same widths Sa and same lengths Sb. Also, each of the sub-pixels 151 may be formed to have regular horizontal intervals Pa and vertical intervals Pb respectively between adjacent sub-pixels 151.

The mask based on the sub-pixels 151 is used to deposit a deposition material. When the substrate is the substrate 150 of the OLED, an organic material is deposited on the substrate according to the form of the sub-pixels 151. Accordingly, the storage unit 112 stores the information about the member on which deposition is to be performed, which is the sub-pixels 151. More specifically, the storage unit 112 stores the widths Sa and lengths Sb of the sub-pixels 151 and the horizontal intervals Pa and vertical intervals Pb between the sub-pixels 151. However, the present embodiment is not limited thereto.

According to an intention of a user, the OLED having the sub-pixels 151, each of which have different sizes and intervals, may be manufactured. In this case, the storage unit 112 may store the widths Sa, the lengths Sb, the horizontal intervals Pa, and the vertical intervals Pb of each sub-pixel 151. While not required in all aspects, the storage unit 112 may store the information about the sub-pixels 151 disposed on the substrate 150 in the form of a map. Also, this information may be stored in the form of a table in which coordinate values are entered.

FIG. 2 illustrates the substrate 150 of the OLED prior to an organic light emitting layer being formed on the substrate 150. The OLED includes an organic light emitting device having the organic emitting layer interposed between a lower electrode and an upper electrode. In FIG. 2, lower electrodes are formed on the substrate 150. More specifically, the sub-pixels 151 may be the lower electrodes exposed after forming the lower electrodes and insulating films.

Information about the sub-pixels 151 is stored in an arbitrary storage medium while the sub-pixels 151 are formed on the substrate 150 so that the storage unit 112 may easily store the information about the sub-pixels 151.

Figure 3:
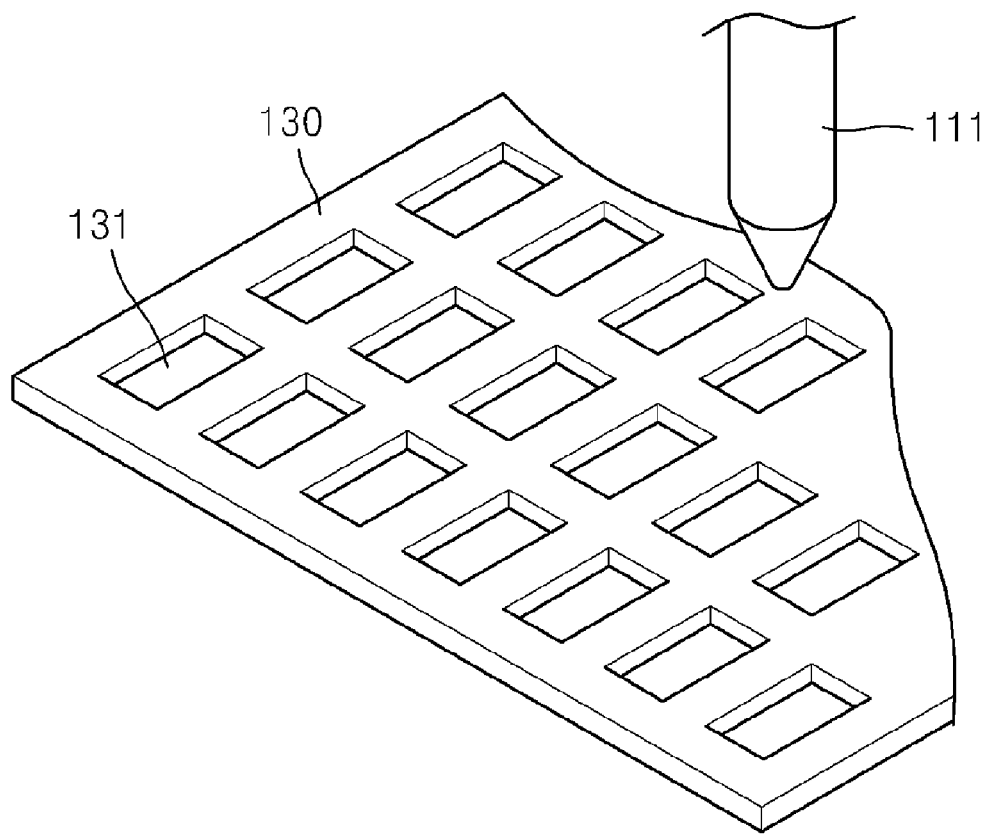
FIG. 3 is a perspective view illustrating inspecting of a mask by using the apparatus for inspecting the mask of FIG. 1.

FIG. 3 is a perspective view illustrating inspecting of the mask by using the mask inspecting apparatus 100. Referring to FIG. 3, the detection unit 111 and the mask 130 are illustrated. The mask 130 includes a plurality of openings 131. The openings 131 are pathways for depositing deposition materials. The detection unit 111 detects information about the openings 131 of the mask 130 from the mask 130 and transmits the information to the control unit (not illustrated), thereby performing mask inspection by using the control unit (not illustrated) and the setting unit (not illustrated).

Although not illustrated, for convenience of inspection, the mask 130 may be disposed on a support which is movable in an X-axis direction and in a Y-axis direction. Accordingly, while the detection unit 111 is fixed, the detection unit 111 may perform inspection of the openings 131 of the mask 130 due to movement of the mask 130. However, it is understood that the detection unit 111 could be movable relative to the mask 130.

Figure 4:
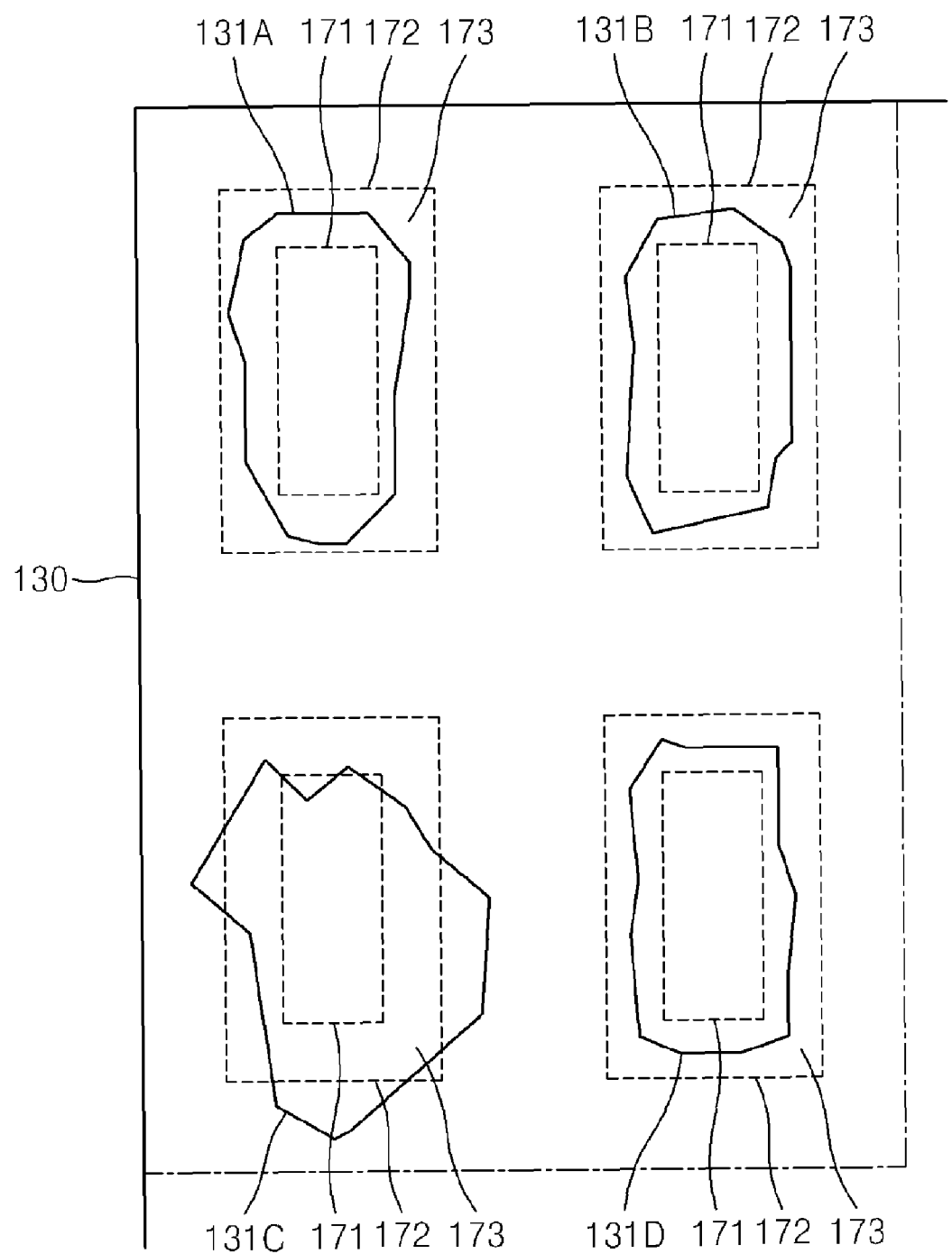
FIG. 4 is a plan view illustrating inspecting of a mask by using the apparatus for inspecting the mask of FIG. 1.

FIG. 4 is a plan view illustrating inspecting of the mask 130 by using the mask inspecting apparatus 100 of FIG. 1. FIG. 4 may be an image detected by the detection unit 111 of FIG. 3. FIG. 4 illustrates a part of the mask 130 having four openings 131: opening A 131A, opening B 131B, opening C 131C, and opening D 131D.

As illustrated in FIG. 4, the openings 131A-131D of the mask 130 are not accurately formed in a desired shape. The openings 131 of the mask 130 are generally formed to have non-uniform boundary lines, since minute patterning for forming the mask 130 is not easy. In particular, when the mask 130 is formed of a metal, it is difficult to accurately form the openings 131 of the mask 130 in a desired shape and size. Accordingly, as illustrated in FIG. 4, the openings 131 may each have a different shape so that the mask 130 needs to be previously inspected in terms of whether the openings 131 of the mask are appropriate for deposition.

Referring to FIG. 4, a first boundary line 171, a second boundary line 172, and a safety area 173 are illustrated around each of the openings 131. The first boundary line 171, the second boundary line 172, and the safety area 173 are not formed on the mask 130 and are virtual lines and a virtual area, respectively. The setting unit 114 of FIG. 1 sets the first boundary line 171, the second boundary line 172, and the safety area 173 using the information about a member on which deposition is to be performed, which is stored in the storage unit 112.

More specifically, when an organic material for the OLED is deposited on the substrate 150, the setting unit 114 sets the first boundary line 171, the second boundary line 172, and the safety area 173 using information about the sub-pixels 151 of the substrate 150 of FIG. 2.

The setting unit 114 sets the first boundary line 171, the second boundary line 172, and the safety area 173 using the information about the widths Sa, the lengths Sb, the horizontal intervals Pa, and the vertical intervals Pb of the sub-pixels 151, along with the information about the substrate 150. When a plurality of cells are formed on the substrate 150, the setting unit 114 sets the first boundary line 171, the second boundary line 172, and the safety area 173 using information about the cells. For example, the information about locations, forms, and sizes of each sub-pixel 151, which is stored in the storage unit 112 in the form of a map, is used to set the first boundary line 171, the second boundary line 172, and the safety area 173 in the form of a map corresponding to each sub-pixel 151.

The first boundary line 171 denotes an inner boundary line of a deposition area on which deposition is to be performed. Since the first boundary line 171 corresponds to the sub-pixel 151 of FIG. 2, the first boundary line 171 may have the same shape and size as the sub-pixel 151. That is, the first boundary line 171 may have the same width Sa and length Sb as the sub-pixel 151. However, in order to have a process margin, the first boundary line 171 may have larger width and length than the width Sa and length Sb of the sub-pixel 151. For example, the setting unit 114 sets the first boundary line 171 to have a larger width and a larger length by a few micrometers compared to the width Sa and length Sb of the sub-pixel 151.

The second boundary line 172 denotes an outer boundary line of an area on which deposition is to be performed, that is, the maximum deposition area. The setting unit 114 sets the second boundary line 172 based on the first boundary line 171, wherein the second boundary line 172 is formed to be larger than the first boundary line 171. The second boundary line 172 may be set in consideration of a process condition. That is, as accuracy of a required deposition pattern increases, the second boundary line 172 is set to be smaller.

The safety area 173 is an area interposed between the first boundary line 171 and the second boundary line 172. When the boundary line of the mask 130 is placed in the safety area 173, the control unit 113 may determine that the openings 131 of the mask 130 are in a normal state.

Referring to FIG. 4, the boundary lines of the opening A 131A, the opening B 131B, and the opening D 131D do not contact the first boundary line 171 and the second boundary line 172 and are only present in the safety area 173. The boundary line of the opening C 131C is present outside of the safety area 173 and contacts the first boundary line 171 and the second boundary line 172. In this case, the control unit 113 determines that the opening A 131A, the opening B 131B, and the opening D 131D are normal, and the opening C 131C has a defect.

In the mask inspecting apparatus 100, according to the shown embodiment, the mask 130 may not contact or be aligned with the member on which deposition is to be performed for inspection of the mask 130. The mask inspecting apparatus 100 sets the first boundary line 171, the second boundary line 172, and the safety area 173 by using the previously set information about the member to be deposited and compares the set first boundary line 171, second boundary line 172, and safety area 173 with the openings 131 of the mask 130, thereby facilitating mask inspection. In other words, all openings of the mask may be easily and accurately inspected and an inspection process is simple, thereby improving efficiency of the process.

Figure 5:
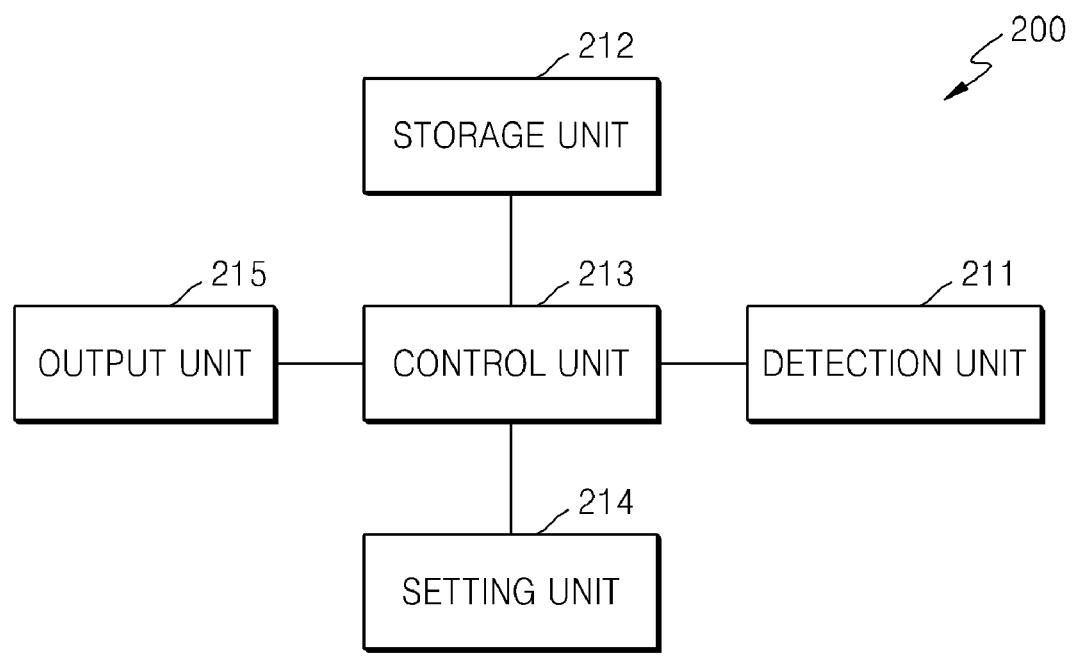
FIG. 5 is a block diagram of an apparatus for inspecting a mask according to another embodiment of the present invention.

FIG. 5 is a block diagram of a mask inspecting apparatus 200 according to another embodiment of the present invention. For convenience of description, only differences between the mask inspecting apparatus 200 and the mask inspecting apparatus 100.

The mask inspecting apparatus 200, according to the present embodiment, includes a detection unit 211, a storage unit 212, a control unit 213, a setting unit 214, and an output unit 215. The output unit 215 included in the mask detecting apparatus 200 may output information about the openings, as determined in the control unit 213. That is, the output unit 215 may output information about the openings determined to be normal and the openings determined to have defects from among all openings of the mask. Accordingly, a user may correct the defective openings with normal openings or change a mask. Examples of the output unit 215 include a display, a printer, or a speaker which output a description of problems.

Figure 6:
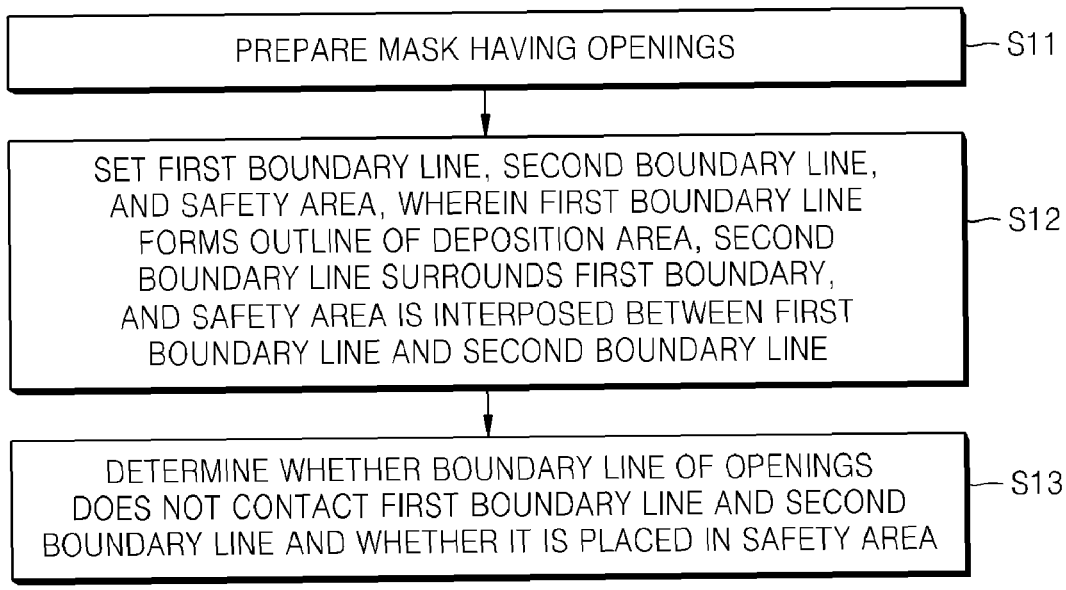
FIG. 6 is a flowchart illustrating a method of inspecting a mask according to an embodiment of the present invention.

FIG. 6 is a flowchart illustrating a method of inspecting a mask according to an embodiment of the present invention. The method includes preparing a mask having openings (Operation 11), setting a first boundary line, a second boundary line, and a safety area, wherein the first boundary line forms an outline of a deposition area, the second boundary line surrounds the first boundary, and the safety area is interposed between the first boundary line and the second boundary line (Operation 12), and determining whether a boundary line of the openings of the mask does not contact the first boundary line and the second boundary line and whether it is placed in the safety area (Operation 13). It is understood that the making of the mask can be performed elsewhere such that operation 11 need not be performed in all aspects of the present invention.

In Operation 11, the mask may be a dot-type mask having openings for deposition.

In Operation 12, a virtual first boundary line, second boundary line, and safety area are set using previously set information about a member on which deposition is to be performed. More specifically, map information about the sub-pixels formed on the substrate, which is the member on which deposition is to be performed, may be used, a process margin may be set to set the first boundary line forming an area larger by a few micrometers than each sub-pixel, and the second boundary line forming a larger area than that formed by the first boundary line may be set. The first and second boundary lines are virtual boundary lines and are set in the form of a map using information, in which coordinate values are illustrated. The first and second boundary lines in the form of a map are compared with the detected boundary line of the mask, thereby facilitating mask inspection.

Figure 7:
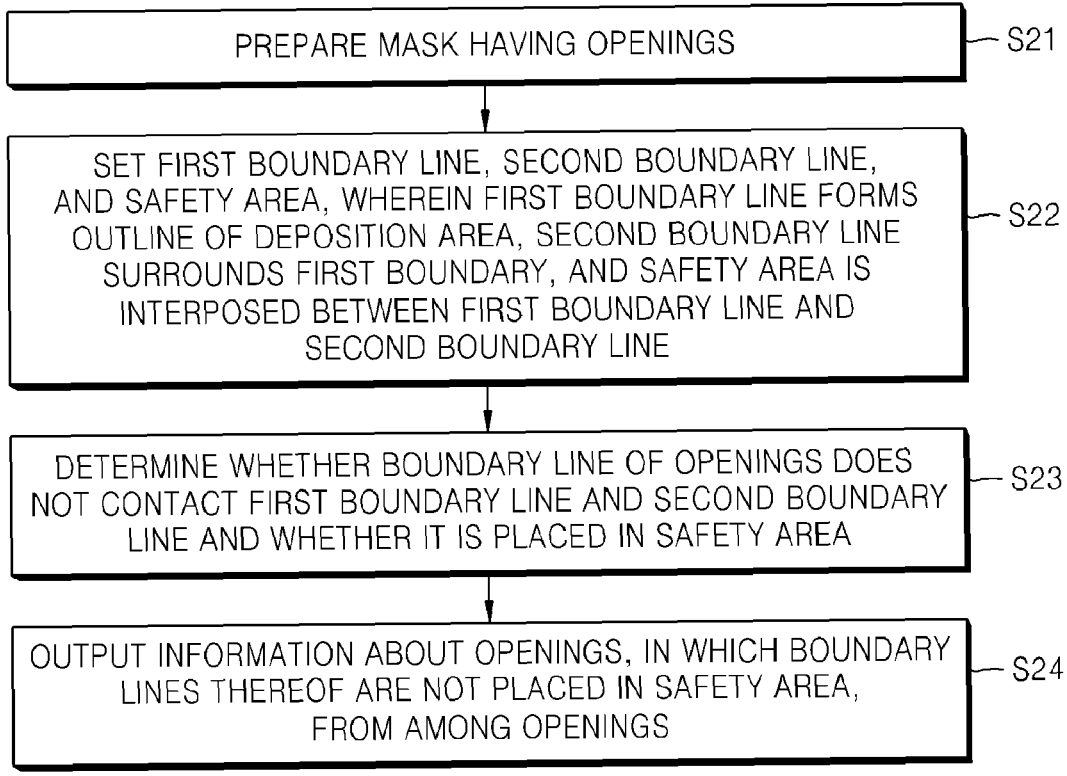
FIG. 7 is a flowchart illustrating a method of inspecting a mask according to another embodiment of the present invention.

FIG. 7 is a flowchart illustrating a method of inspecting a mask according to another embodiment of the present invention. The method includes preparing a mask having openings (Operation 21), setting a first boundary line, a second boundary line, and a safety area, wherein the first boundary line forms an outline of a deposition area, the second boundary line surrounds the first boundary, and the safety area is interposed between the first boundary line and the second boundary line (Operation 22), determining whether a boundary line of the openings of the mask does not contact the first boundary line and the second boundary line and whether it is placed in the safety area (Operation 23), and outputting information about the openings, in which the boundary lines thereof are not placed in the safety area, from among the openings (Operation 24).

In operation 24, information about the openings determined to have defects from among the openings of the mask is output. Such information may include coordinate information indicating locations of the openings. Accordingly, only defective openings may be selectively corrected. Also, when a predetermined number or more of defective openings exist, it is determined that the mask has a defect and thus may be changed.

In the apparatus and method of inspecting a method according to aspects of the present invention, a defect of the mask may be easily inspected using the openings of the mask.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A mask inspecting apparatus for inspecting a mask having openings used in deposition in a desired pattern, the apparatus comprising:
   a detection unit for detecting a boundary line of each of the openings of the mask;
   a storage unit for storing information about a member on which deposition is to be performed using the mask;
   a setting unit for setting a first boundary line, a second boundary line, and a safety area for each of the openings using the stored information about the member on which deposition is to be performed, wherein the first boundary line forms an outline of a deposition area, the second boundary line surrounds the first boundary line, and the safety area is interposed between the first boundary line and the second boundary line;
   a control unit for determining whether the boundary line of the mask detected by the detection unit does not contact the first boundary line and the second boundary line and whether the boundary line is present in the safety area; and
   an output unit for outputting information about openings contacting at least one of the first boundary line and the second boundary line and are in an area that is not in the safety area.

2. The apparatus of claim 1, wherein the setting unit sets the first boundary line, the second boundary line, and the safety area as a virtual map according to the information about the member on which deposition is to be performed.

3. The apparatus of claim 1, wherein the information about the member on which deposition is to be performed comprises information about a substrate, cells and sub-pixels on the substrate, and intervals between the sub-pixels.

4. The apparatus of claim 1, wherein the detection unit is a charge-coupled device (CCD) camera.

5. A method of inspecting a mask having a plurality of openings used in deposition in a desired pattern, the method comprising:
   preparing the mask having the plurality of openings formed in a predetermined pattern used in deposition in the desired pattern;
   setting a first boundary line, a second boundary line, and a safety area for each of the openings according to information about a member on which deposition is to be performed, wherein the first boundary line forms an outline of a deposition area, the second boundary line surrounds the first boundary line, and the safety area is between the first boundary line and the second boundary line;
   determining whether the boundary line of each of the openings of the mask does not contact the first boundary line and the second boundary line and whether the first and second boundary lines are present in areas that are not the safety areas; and
   outputting information about which of the openings, which are not present in the safety area, from among the plurality of openings after performing the determining.

6. The method of claim 5, wherein in the setting of the first boundary lines, the second boundary lines, and the safety areas, the first boundary lines, the second boundary lines, and the safety areas are stored as a virtual map according to the information about the member on which deposition is to be performed.

7. The method of claim 5, wherein the information about the member on which deposition is to be performed comprises information about a substrate, cells and sub-pixels on the substrate, and intervals between the sub-pixels.

8. The method of claim 5, wherein the boundary lines of the openings are detected using a detection unit.

9. The method of claim 8, wherein the detection unit is a charge-coupled device (CCD) camera.

10. A central processing unit (CPU) for generating a virtual map of a mask used in a mask inspecting apparatus, the virtual map comprising virtual lines and virtual areas corresponding to acceptable boundary lines of openings of the mask, the CPU comprising:
   a control unit for
      generating the virtual map according to virtual boundary lines of the openings of the mask,
      comparing the virtual map against detected boundary lines of the openings of the mask, and outputting information about which of the openings whose corresponding said detected boundary lines do not correspond to respective said acceptable boundary lines.

11. The CPU of claim 10, wherein the CPU is disposed in the mask inspecting apparatus, the mask inspecting apparatus comprising:
a detection unit for detecting the detected boundary lines of the openings of the mask;
a storage unit for storing information about a member on which deposition is to be performed using the mask;
a setting unit for setting the virtual boundary lines using the stored information to generate the virtual map; and
an output unit for outputting the information about which of the openings whose corresponding said detected boundary lines do not correspond to respective said acceptable boundary lines.

12. The CPU of claim 11, wherein the virtual lines of the openings of the mask comprise
first boundary lines forming inner perimeters of deposition areas corresponding to respective openings of the mask, and
second boundary lines forming corresponding outer perimeters of the deposition areas that surround respective said first boundary lines.

13. The CPU of claim 12,
wherein the virtual areas of the openings of the mask comprise corresponding safety areas interposed between respective said first boundary lines and respective said second boundary lines, and
wherein the acceptable boundary lines are disposed entirely within respective said safety areas.

14. The CPU of claim 12, wherein the control unit is configured to determine that one of the openings is defective when the corresponding detected boundary line intersects with the respective first boundary line or the respective second boundary line.

15. A method of generating a virtual map of a mask used in a mask inspecting apparatus for inspecting the mask, the mask having openings used in deposition in a desired pattern, the virtual map comprising virtual lines and virtual areas corresponding to acceptable boundary lines of the openings of the mask, the mask inspecting apparatus comprising a computer comprising a processor for executing instructions and an output device for outputting information about the mask inspecting, the method comprising:
detecting, by the processor, boundary lines of the openings of the mask;
comparing, by the processor, the detected boundary lines with the virtual map to determine which of the openings are defective; and
outputting, by the output device, information about which of the openings are defective.

16. The method of claim 15, further comprising:
generating, by the processor, the virtual map by setting first boundary lines, second boundary lines, and safety areas according to information about a member on which the deposition is to be performed,
wherein the first boundary lines form inner perimeters of deposition areas corresponding to respective openings of the mask and the second boundary lines form corresponding outer perimeters of the deposition areas that surround respective said first boundary lines.

17. The method of claim 16, wherein the second boundary lines are set according to a process margin having a larger width and length than corresponding said openings of the mask.

18. A computer readable storage medium comprising instructions that when executed by the processor cause the computer to execute the method of claim 15.

* * * * *